United States Patent
Hornik et al.

(10) Patent No.: US 6,746,877 B1
(45) Date of Patent: Jun. 8, 2004

(54) ENCAPSULATION OF FERROELECTRIC CAPACITORS

(75) Inventors: Karl Hornik, Kanagawa-ken (JP); Ulrich Egger, Kanagawa-ken (JP); Rainer Bruchhaus, Kanagawa-ken (JP)

(73) Assignee: Infineon AG, Munich (DE)

( * ) Notice: Subject to any disclaimer, the term of this patent is extended or adjusted under 35 U.S.C. 154(b) by 0 days.

(21) Appl. No.: 10/338,798

(22) Filed: Jan. 7, 2003

(51) Int. Cl.[7] .................. H01L 21/00; H01L 21/8242
(52) U.S. Cl. .................... 438/3; 438/254; 438/398; 438/240; 438/739; 257/295; 257/310
(58) Field of Search ................. 438/3, 239–241, 438/250–256, 396–399, 739; 257/295–299, 303–306, 310–311

(56) References Cited

U.S. PATENT DOCUMENTS

| | | | | |
|---|---|---|---|---|
| 5,385,859 A | * | 1/1995 | Enomoto | 438/254 |
| 5,416,037 A | * | 5/1995 | Sato et al. | 438/254 |
| 5,654,222 A | * | 8/1997 | Sandhu et al. | 438/3 |
| 5,721,153 A | * | 2/1998 | Kim et al. | 438/398 |
| 5,744,390 A | * | 4/1998 | Chao | 438/254 |
| 5,847,424 A | * | 12/1998 | Kang | 257/306 |
| 5,960,293 A | * | 9/1999 | Hong et al. | 438/397 |
| 6,027,969 A | * | 2/2000 | Huang et al. | 438/254 |
| 6,238,968 B1 | * | 5/2001 | Yu et al. | 438/253 |
| 6,300,186 B1 | * | 10/2001 | Hirota et al. | 438/239 |
| 6,333,226 B1 | * | 12/2001 | Yoshida et al. | 438/253 |
| 6,500,709 B2 | * | 12/2002 | Parekh et al. | 438/255 |
| 2003/0129771 A1 | * | 7/2003 | Summerfelt et al. | 438/3 |

FOREIGN PATENT DOCUMENTS

JP         04249362 A   *  9/1992   ......... H01L/27/108

* cited by examiner

*Primary Examiner*—John F. Niebling
*Assistant Examiner*—Jennifer M. Kennedy
(74) *Attorney, Agent, or Firm*—Fish & Richardson P.C.

(57) ABSTRACT

A ferroelectric capacitor encapsulation method for preventing hydrogen damage to electrodes and ferroelectric material of the capacitor. In general terms, the method for encapsulating a capacitor includes etching a bottom electrode of a capacitor to expose an underlying wafer surface. An undercut is etched between the capacitor and the wafer surface. The undercut is refilled with a barrier layer to reduce the diffusion of hydrogen from the surface of the wafer into the capacitor.

16 Claims, 6 Drawing Sheets

ENCAPSULATION OF FERROELECTRIC CAPACITORS

FIELD OF THE INVENTION

The present invention relates to capacitor encapsulation to prevent hydrogen damage.

BACKGROUND OF THE INVENTION

There have been several integration challenges such as inter-metal dielectrics and passivation to be resolved for realizing commercial ferroelectric random access memory (FeRAM). These problems are mostly due to damage from contaminants, particularly hydrogen damage generated during, for example, back-end processing of IMD, passivation, forming a gas anneal and plasma-TEOS deposition. The hydrogen ions and electrons, impregnated during, for example, the plasma-enhanced chemical vapor deposition (PECVD) process using $SiH_4$-based gas chemistry, diffuse into the ferroelectric layers such as PZT or SBT and then pin ferroelectric domains. Moreover, in the worst case, the ferroelectric, as well as certain electrode materials such as SRO ($SrRuO_3$) will decompose due to the $H_2$ attack. Both mechanisms lead to considerable degradation of ferroelectric performance of the FeRAM's capacitor. There are many reports of previous efforts attempting to solve the hydrogen-induced problem. One of the efforts involves the insertion of a proper barrier, for example $Al_2O_3$, directly over the capacitor. However, these efforts have had limited success due to incomplete encapsulation. The barrier does not protect the bottom of the capacitor.

FIGS. 1–3 show a conventional process for encapsulating ferroelectric capacitors.

FIG. 1 shows a wafer 1 following prior art processing steps. A top electrode (TE) 6 is covered with a TEOS (Tetraethyl Orthosilicate) hardmask 2 and mask resist strip patterning is performed using halogen or CO-based chemistry to etch material s such as Iridium, Platinum, Iridium Oxide or various conductive oxide films. A portion of an underlying ferroelectric layer 8 (for example, PZT, SBT, or BLT) is also etched. A FE capacitor 5 is formed from the top electrode 6, ferroelectric layer 8 and a bottom electrode (BE) 3 as shown in the magnified view of the figure.

A Ti glue-layer 7 serves to adhere the bottom electrode 3 to the substructure of the FE capacitor 5. The substructure includes a top TEOS layer 15 covering a top nitride layer 9. Between the Ti glue-layer 7 and the bottom electrode 3 can be layers of Ir (Iridium), $IrO_2$ (Iridium Oxide) or other materials. A poly silicon contact plug 13 passes through the wafer 1 to form an electrical connection between an active region and the bottom electrode 3.

Another TEOS hardmask 4 is deposited in preparation for a second etching step. During the second etching step, the ferroelectric layer 8 is further etched along with the bottom electrode 3. There is a slight over-etch through the top TEOS layer 15 along with any intermediate materials such as the layers of Ir (Iridium) and $IrO_2$ (Iridium Oxide). FIG. 2 shows the wafer 1 following this conventional patterning of the bottom electrode 3.

FIG. 3 shows the prior art insertion of a barrier layer 19, for example $Al_2O_3$, over the ferroelectric capacitor 5 after the etching steps.

SUMMARY OF THE INVENTION

The present invention provides a ferroelectric capacitor encapsulation method for preventing hydrogen damage to the electrodes and ferroelectric material of the capacitor.

In general terms, the invention is a method for encapsulating a capacitor comprising etching a bottom electrode of a capacitor to expose an underlying wafer surface. Next an undercut is etched between the capacitor and the wafer surface. The undercut is then refilled with a barrier layer to reduce the diffusion of hydrogen from the surface of the wafer into the capacitor.

BRIEF DESCRIPTION OF THE FIGURES

Further preferred features of the invention will now be described for the sake of example only with reference to the following figures, in which.

DETAILED DESCRIPTION OF THE EMBODIMENTS

The present invention includes an advanced single-step encapsulation of a ferroelectric capacitor using a well defined Ti-undercut which is subsequently refilled with ALD $Al_2O_3$.

Figure 1:
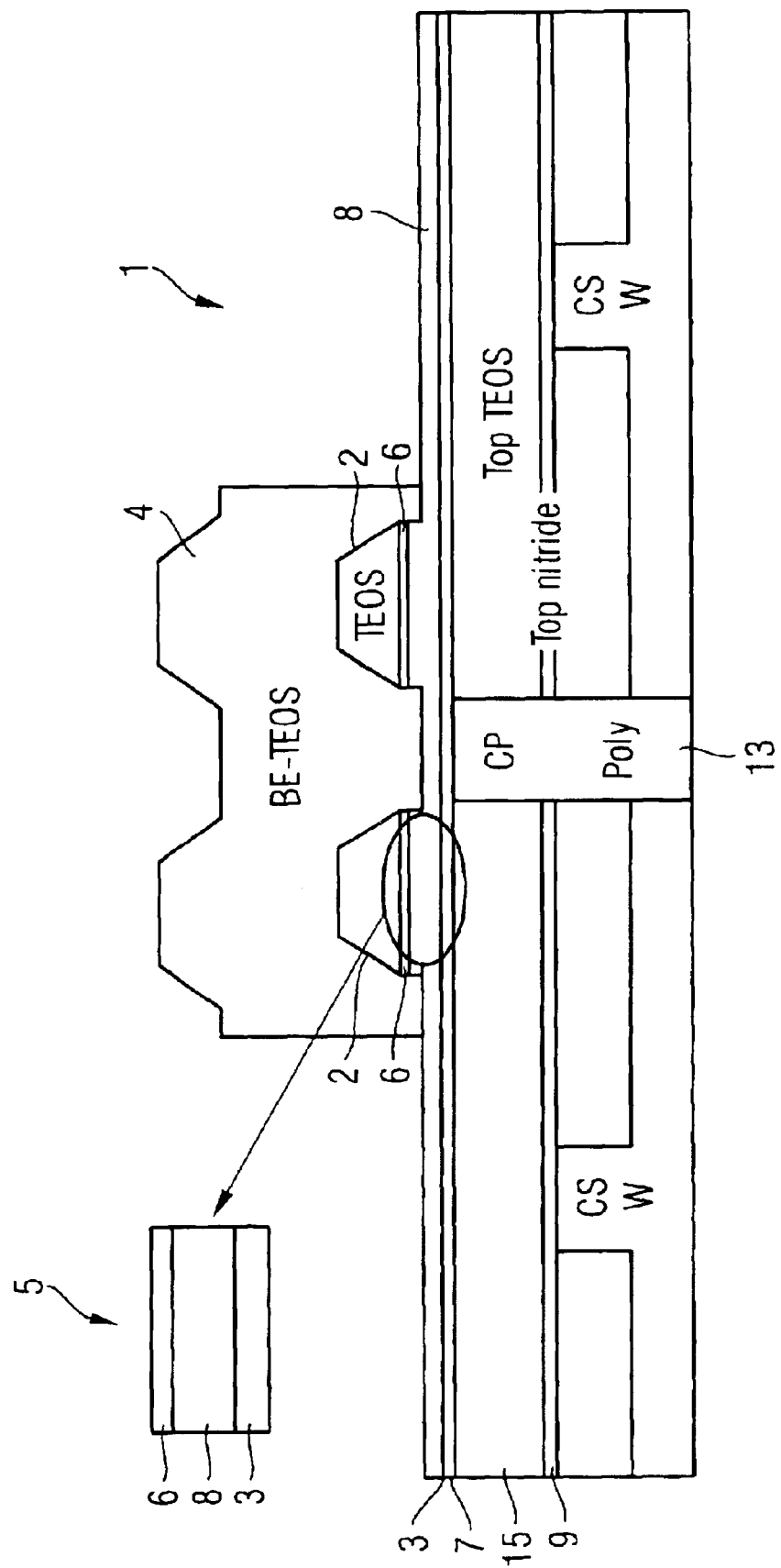
FIG. 1 shows a prior-art FeRAM capacitor.
Figure 2:
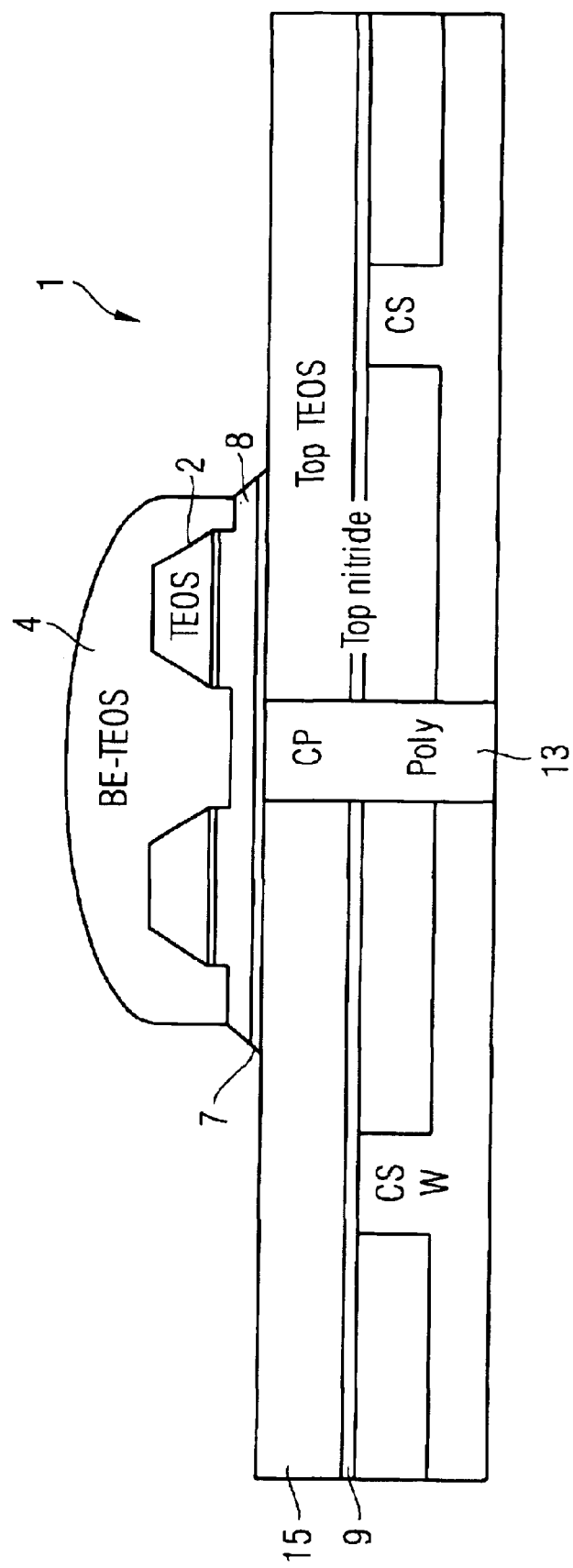
FIG. 2 shows the capacitor after being etched using a conventional process.
Figure 3:
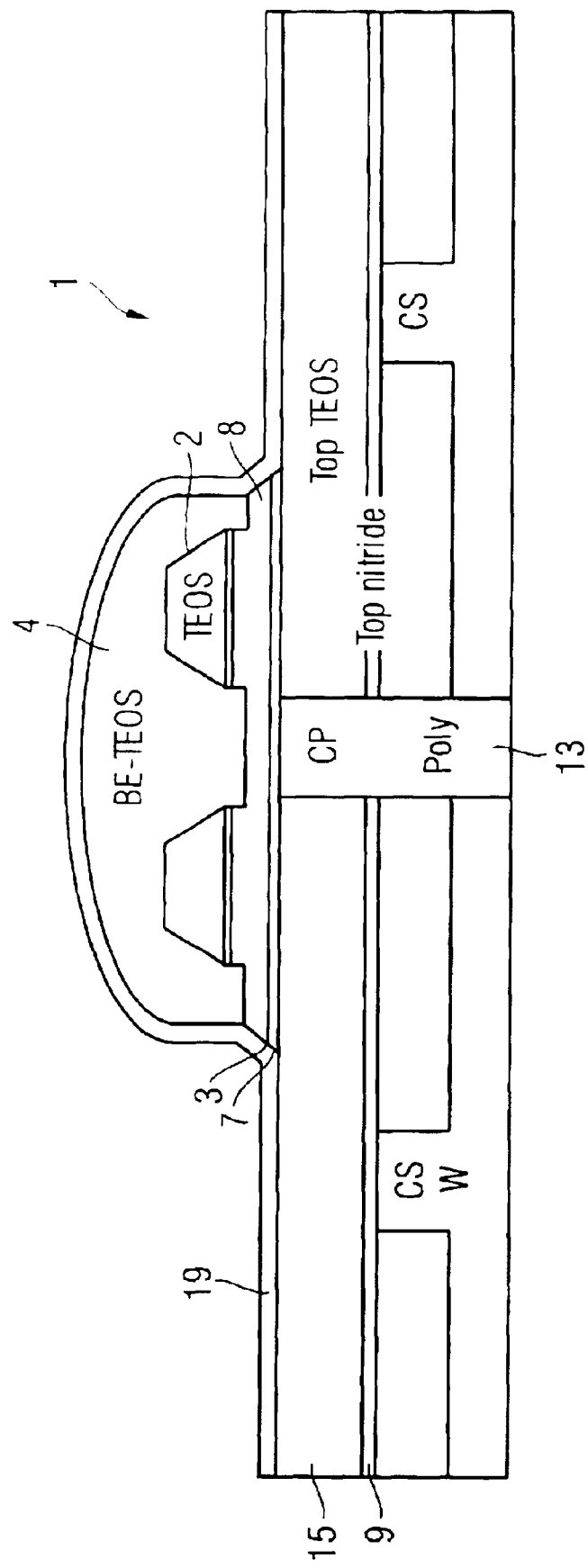
FIG. 3 shows the prior art insertion of a barrier layer over the capacitor.
Figure 6:
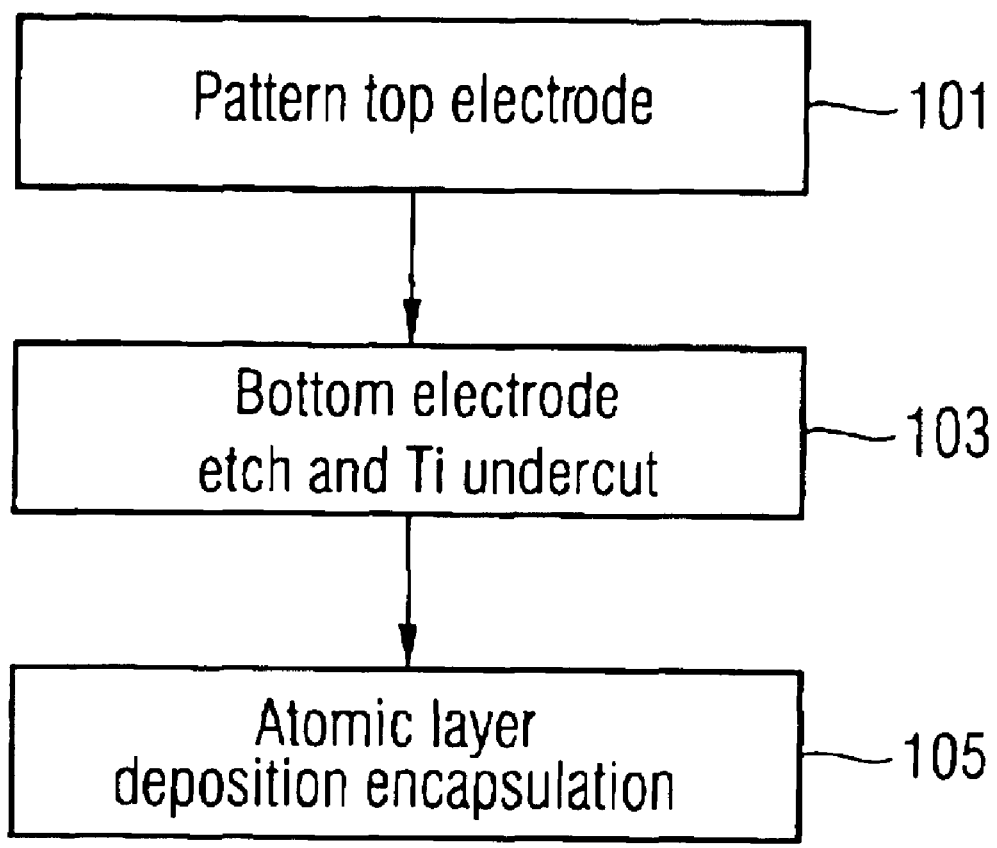
FIG. 6 shows the method steps for fabricating the capacitor of FIG. 5.

The process of the present invention is described beginning with the patterned top electrode 6 and etching into the ferroelectric layer 8 as illustrated and previously described with respect to FIG. 1 and illustrated by step 101 in FIG. 6.

Figure 4:
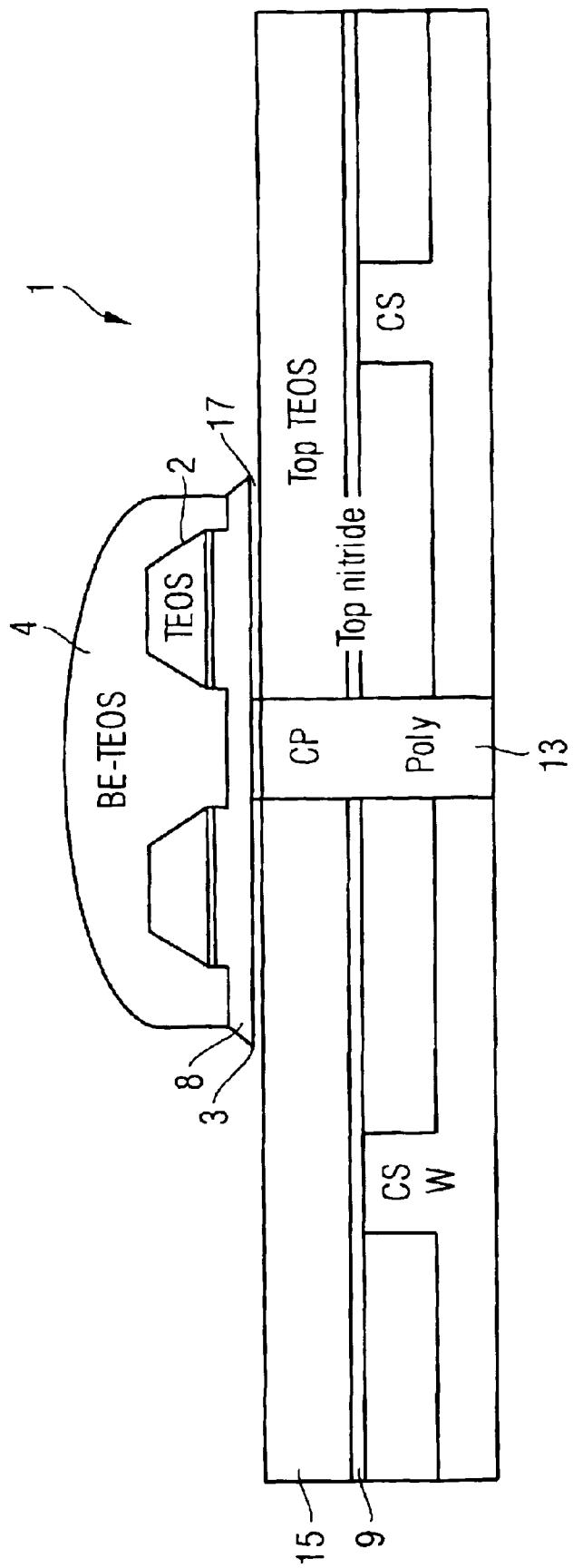
FIG. 4 shows the capacitor of FIG. 1 following the undercut etch of the present invention.

Following patterning of the top electrode 6, the bottom electrode is etched using the conventional process with a slight over etch into the underlying top TEOS layer 15 as illustrated in FIG. 4. Additionally, in the present invention, unlike the prior art, a Ti undercut 17 is created using a fluorine rich chemistry in combination with high temperature (>300° C.) and low bias power to a chuck securing the wafer 1. Low bias power is used in order to decrease the physical component of the etching step by ensuring lower acceleration of plasma ions. At this step fences (the residues from the etching process typically on the sidewalls) are removed and a well defined Ti-undercut 17 between the bottom electrode 3 and the poly silicone plug 13 is formed. The etching stops at the plug 13 due to the plug's different material composition. This etch and undercut step is illustrated as step 103 in FIG. 6.

Figure 5:
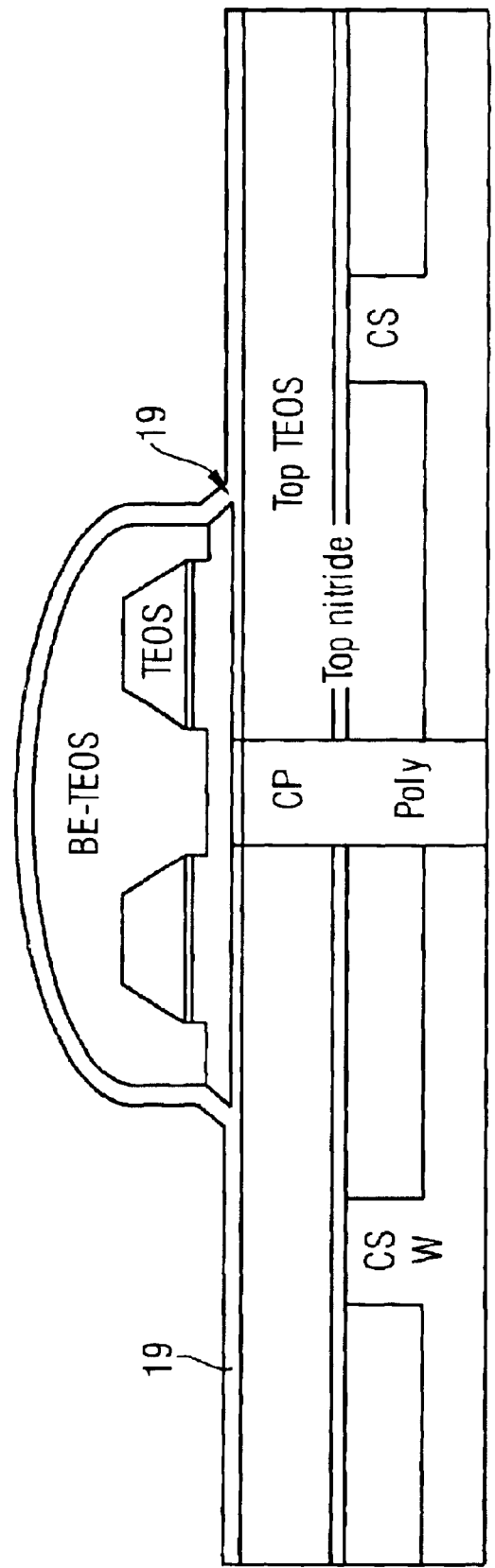
FIG. 5 shows the capacitor of FIG. 4 following encapsulation of the capacitor with a barrier layer.

After etching the undercut, encapsulation with ALD (Atomic Layer Deposition) $Al_2O_3$ technology is used to refill the undercut and cover the capacitor with the barrier layer 19, including a large part of the bottom side, in a single step illustrated by FIG. 5 and the step 105 in FIG. 6. This $Al_2O_3$ cover around the capacitor substantially blocks a diffusion path for hydrogen through the underlying TEOS layer. The Ti directly above the poly silicone plug 13 is typically not replaced entirely with $Al_2O_3$ because the result would be to interrupt the electrical connection between the capacitor and active region.

Although the invention has been described above using particular embodiments, many variations are possible within the scope of the claims, as will be dear to a skilled reader.

We claim:

1. A method for encapsulating a capacitor comprising:

etching a bottom electrode of a capacitor to expose an underlying wafer surface;

etching an undercut between the capacitor and the wafer surface; and refilling the undercut with a barrier layer to reduce the diffusion of contaminants from the surface of the wafer into the capacitor.

2. The method of claim 1, further comprising the step of, in addition to refilling the undercut with a barrier layer, covering the top of the capacitor with the barrier layer to encapsulate the capacitor.

3. The method of claim 1, wherein the capacitor comprises a ferroelectric material, and further comprising the step of reducing the diffusion of hydrogen into ferroelectric material in the capacitor by using the barrier layer within the undercut.

4. The method of claim 1, wherein the underlying wafer surface is TEOS.

5. The method of claim 1, wherein the contaminants are hydrogen.

6. The method of claim 1, wherein the etching the undercut step is performed by etching a Ti layer located between the capacitor and the wafer.

7. The method of claim 5, wherein the Ti serves to adhere the capacitor to the wafer.

8. The method of claim 1 wherein the undercut passes between the capacitor and the wafer and ends at a contact plug passing through the wafer.

9. The method of claim 1, wherein the undercut is etched using a fluorine rich chemistry.

10. The method of claim 1, wherein undercut is etched at high temperature.

11. The method of claim 10, wherein undercut is etched at a temperature greater than 300° C.

12. The method of claim 1, further comprising the step of supplying low bias power to a chuck securing the wafer during the etching of the undercut.

13. The method of claim 1, wherein the step of refilling the undercut with the barrier layer includes using atomic layer deposition.

14. The method of claim 1, wherein the barrier layer is $Al_2O_3$.

15. The method of claim 1, wherein the capacitor comprises a ferroelectric, and further comprising the step of using the barrier layer to reduce the diffusion of hydrogen into the ferroelectric to reduce degradation of ferroelectric performance.

16. The method of claim 1, wherein the capacitor comprises a ferroelectric, and further comprising the step of using the barrier layer to reduce the diffusion of hydrogen into the ferroelectric to reduce decomposition of the electrode.

* * * * *

UNITED STATES PATENT AND TRADEMARK OFFICE
CERTIFICATE OF CORRECTION

PATENT NO. : 6,746,877 B1
DATED : June 8, 2004
INVENTOR(S) : Karl Hornik, Ulrich Egger and Rainer Bruchhaus It is certified that error appears in the above-identified patent and that said Letters Patent is hereby corrected as shown below:

<u>Title page,</u>
Item [73], Assignee, "Infineon AG" should be -- Infineon Technologies AG --.

Signed and Sealed this

Twenty-first Day of March, 2006

JON W. DUDAS
*Director of the United States Patent and Trademark Office*